US006880561B2

(12) United States Patent
Goto et al.

(10) Patent No.: US 6,880,561 B2
(45) Date of Patent: Apr. 19, 2005

(54) FLUORINE PROCESS FOR CLEANING SEMICONDUCTOR PROCESS CHAMBER

(75) Inventors: Haruhiro Harry Goto, Saratoga, CA (US); William R. Harshbarger, San Jose, CA (US); Quanyuan Shang, Saratoga, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/430,955

(22) Filed: May 5, 2003

(65) Prior Publication Data

US 2003/0192569 A1 Oct. 16, 2003

Related U.S. Application Data

(62) Division of application No. 09/535,692, filed on Mar. 27, 2000, now abandoned.

(51) Int. Cl.$^7$ ................................................ B08B 9/00
(52) U.S. Cl. ................ 134/22.1; 134/19; 134/22.18; 134/31; 134/902; 438/905; 216/58; 216/63; 216/79
(58) Field of Search ............... 134/19, 22.1, 22.18, 134/31, 902, 34, 35, 42; 438/905; 216/58, 63, 79

(56) References Cited

U.S. PATENT DOCUMENTS

| | | |
|---|---|---|
| 2,879,212 A | 3/1959 | Hill et al. |
| 3,146,179 A | 8/1964 | Davies |
| 3,684,667 A | 8/1972 | Sayce |
| 3,976,447 A | 8/1976 | Merchant et al. |
| 4,125,443 A | 11/1978 | Grant et al. |
| 4,176,018 A | 11/1979 | Faron |
| 4,312,718 A | 1/1982 | Watanabe et al. |
| 4,498,953 A | 2/1985 | Cook et al. ................. 156/646 |
| 4,786,361 A | 11/1988 | Sekine et al. ............... 156/643 |
| 4,818,326 A | 4/1989 | Liu et al. |
| 4,854,263 A | 8/1989 | Chang et al. ............... 118/715 |
| 4,867,841 A | 9/1989 | Loewenstein et al. |
| 4,900,395 A | 2/1990 | Syverson et al. |
| 4,960,488 A | 10/1990 | Law et al. |
| 5,000,113 A | 3/1991 | Wang et al. ................ 118/723 |
| 5,002,632 A | 3/1991 | Loewenstein et al. |
| 5,129,958 A | 7/1992 | Nagashima et al. ........ 134/22.1 |
| 5,180,466 A | 1/1993 | Shin ........................... 156/643 |
| 5,207,836 A | 5/1993 | Chang |
| 5,284,605 A | 2/1994 | Nicolas |
| 5,298,112 A | 3/1994 | Hayasaka et al. |
| 5,302,236 A | 4/1994 | Tahara et al. ............... 156/643 |
| 5,336,832 A | 8/1994 | Keller |
| 5,366,585 A | 11/1994 | Robertson et al. .......... 156/643 |
| 5,378,324 A | 1/1995 | Hodgson |
| 5,405,491 A | 4/1995 | Shahvandi et al. |
| 5,406,008 A | 4/1995 | Sievert |
| 5,421,902 A * | 6/1995 | Odajima et al. .............. 134/19 |
| 5,425,842 A | 6/1995 | Zijlstra ...................... 156/643.1 |
| 5,443,686 A * | 8/1995 | Jones et al. .................... 216/37 |
| 5,449,411 A | 9/1995 | Fukuda et al. .............. 118/723 |
| 5,534,107 A | 7/1996 | Gray et al. ............... 156/643.1 |
| 5,549,802 A | 8/1996 | Guo |
| 5,565,038 A | 10/1996 | Ashley |
| 5,569,151 A | 10/1996 | Karwacki et al. |
| 5,597,495 A | 1/1997 | Keil et al. ..................... 216/66 |
| 5,620,526 A | 4/1997 | Watatani et al. ............. 134/1.1 |
| 5,628,894 A | 5/1997 | Tarancon |
| 5,679,215 A | 10/1997 | Barnes et al. |
| 5,685,916 A | 11/1997 | Ye et al. |
| 5,688,384 A | 11/1997 | Hodgeson et al. |
| 5,693,147 A | 12/1997 | Ward et al. |
| 5,705,080 A | 1/1998 | Leung et al. |
| 5,726,480 A | 3/1998 | Pister ......................... 257/415 |
| 5,756,400 A | 5/1998 | Ye et al. ..................... 438/710 |
| 5,762,813 A | 6/1998 | Takiyama et al. |
| 5,770,098 A | 6/1998 | Araki et al. .................. 216/67 |
| 5,779,866 A | 7/1998 | Tarancon |
| 5,788,778 A | 8/1998 | Shang et al. |
| 5,788,799 A | 8/1998 | Steger et al. |
| 5,824,607 A | 10/1998 | Trow et al. ................. 438/732 |
| 5,830,807 A | 11/1998 | Matsunaga et al. ......... 438/714 |
| 5,844,195 A | 12/1998 | Fairbairn et al. |
| 5,844,205 A | 12/1998 | White et al. ................ 219/390 |
| 5,846,886 A | 12/1998 | Hattori et al. |
| 5,849,092 A | 12/1998 | Xi et al. |
| 5,849,639 A | 12/1998 | Molloy et al. |
| 5,872,061 A | 2/1999 | Lee et al. |
| 5,880,031 A | 3/1999 | Wong |
| 5,880,032 A | 3/1999 | Doi et al. |

(Continued)

FOREIGN PATENT DOCUMENTS

| | | |
|---|---|---|
| DE | 429809 | 6/1926 |
| EP | 0 697 467 A1 | 2/1996 |
| EP | 0 819 780 | 1/1998 |

(Continued)

OTHER PUBLICATIONS

"Appendix B Alternative Fluorinating Agents" *Evaluation of the U.S. Dept. of Energy*; http://www.nap.edu/openbook/0309056845/html/104.html, copyright, 2001.

(Continued)

Primary Examiner—M. Kornakov
(74) Attorney, Agent, or Firm—Moser, Patterson & Sheridan LLP

(57) ABSTRACT

A process for removing residue from the interior of a semiconductor process chamber using molecular fluorine gas ($F_2$) as the principal precursor reagent. In one embodiment a portion of the molecular fluorine is decomposed in a plasma to produce atomic fluorine, and the resulting mixture of atomic fluorine and molecular fluorine is supplied to the chamber whose interior is to be cleaned. In another embodiment the molecular fluorine gas cleans the semiconductor process chamber without any plasma excitation. Molecular fluorine gas has the advantage of not being a global warming gas, unlike fluorine-containing gas compounds conventionally used for chamber cleaning such as $NF_3$, $C_2F_6$ and $SF_6$.

12 Claims, No Drawings

U.S. PATENT DOCUMENTS

| | | | |
|---|---|---|---|
| 5,888,309 A | 3/1999 | Yu | |
| 5,904,566 A | 5/1999 | Tao et al. | |
| 5,922,219 A | 7/1999 | Fayfield et al. | 216/58 |
| 5,935,874 A | 8/1999 | Kennard | |
| 5,958,801 A | 9/1999 | Langley | 438/738 |
| 5,970,376 A | 10/1999 | Chen | |
| 5,980,769 A | 11/1999 | Yanagisawa et al. | |
| 6,007,733 A | 12/1999 | Jang et al. | |
| 6,014,979 A | 1/2000 | Van Autryve et al. | |
| 6,015,761 A | 1/2000 | Merry et al. | |
| 6,020,035 A | 2/2000 | Gupta et al. | |
| 6,024,887 A | 2/2000 | Kuo et al. | |
| 6,024,888 A | 2/2000 | Watanabe et al. | |
| 6,029,718 A | 2/2000 | Jackson et al. | |
| 6,051,505 A | 4/2000 | Chu et al. | |
| 6,055,927 A | 5/2000 | Shang et al. | |
| 6,109,206 A | 8/2000 | Mayden et al. | |
| 6,117,793 A | 9/2000 | Tang | 438/740 |
| 6,125,859 A | 10/2000 | Kao et al. | |
| 6,159,333 A | 12/2000 | Gupta et al. | |
| 6,209,483 B1 | 4/2001 | Dyer | |
| 6,255,222 B1 | 7/2001 | Xia et al. | |
| 6,264,852 B1 | 7/2001 | Herchen et al. | |
| 6,271,148 B1 | 8/2001 | Kao et al. | |
| 6,286,451 B1 | 9/2001 | Ishikawa et al. | 118/723 I |
| 6,352,081 B1 | 3/2002 | Lu et al. | |
| 6,362,031 B1 | 3/2002 | Yamaguchi et al. | 438/158 |
| 6,366,346 B1 | 4/2002 | Nowak et al. | |
| 6,366,366 B1 | 4/2002 | Nakamura | |
| 6,374,831 B1 | 4/2002 | Chandran et al. | |
| 6,379,575 B1 | 4/2002 | Yin et al. | |
| 6,380,103 B1 * | 4/2002 | Gonzalez et al. | 438/774 |
| 6,387,288 B1 | 5/2002 | Bjorkman et al. | |
| 6,500,356 B1 | 12/2002 | Goto et al. | 216/72 |
| 6,527,968 B1 | 3/2003 | Wang et al. | |
| 6,544,345 B1 | 4/2003 | Mayer et al. | |
| 6,602,433 B1 | 8/2003 | Bhardqaj et al. | |
| 2003/0098038 A | 5/2000 | Siegele et al. | |
| 2002/0074013 A1 | 6/2002 | Shang et al. | |
| 2003/0010354 A1 | 1/2003 | Goto et al. | |
| 2003/0109144 A1 | 6/2003 | Goto et al. | |
| 2003/0121796 A1 | 7/2003 | Siegele et al. | |
| 2003/0192569 A1 | 10/2003 | Goto et al. | |

FOREIGN PATENT DOCUMENTS

| | | | |
|---|---|---|---|
| EP | 0 965 661 A2 | 12/1999 | |
| EP | 1 076 355 A2 | 2/2001 | |
| JP | 3077786 | 4/1991 | |
| JP | 4311570 | 11/1992 | |
| JP | 2001-35801 | * 11/1992 | |
| JP | 5-109673 | 4/1993 | |
| JP | 6033054 | 2/1994 | |
| JP | 6080962 | 3/1994 | |
| JP | 407099187 | * 4/1995 | |
| JP | 08-017804 A | 1/1996 | |
| JP | 0 801 780 4 | 1/1996 | H01L/21/3065 |
| JP | 8060368 | 5/1996 | |
| WO | WO-99/02754 | 1/1999 | |
| WO | WO-99/06611 | 2/1999 | |
| WO | WO-99/28538 | 6/1999 | |
| WO | WO-00/51938 | 9/2000 | |
| WO | WO-00/52740 | 9/2000 | |

OTHER PUBLICATIONS

"Seventh Generation PECVD System Announced Overcoming Obstacles to Increase the Substrate Size" *AKT News Excerpt; Electronic Journal*, Nov., 2003.

Foon, Ruby; "Kinetics of Gaseous Fluorine Reactions" *Prog. Reaction Kinetics*, 1975, vol. 8, No. 2, pp. 81–160 Pergamon Press, Printed in Great Britain.

International Sematech, "Motorola Evaluation of the Applied Science and Technology, Inc. (ASTeX) Astron Technology for Perfluorocompound (PFC) Emissions Reductions on the Applied Materials DxL Chemical Vapor Deposition (CVD) Chamber", Apr. 16, 1999.

Flamm, et al., "Reaction of fluorine atoms with $SiO_2$," J.Appl. Phys., 50 (10), (Oct. 1979) 6211–13.

Donnelly, et al. Studies of chemiluminescence accompanying fluorine atom etching of silicon,: J. Appl. Phys., 51 (190) (Oct. 1980) 5273–76.

Flamm, et al., "The reaction of fluorine atoms with silicon," J. Appl. Phys. 52 (5) (May 1981) 3633–39.

Aliev, V.S. et al., "Development of Si (100) Surface Roughness at the Initial Stage of Etching in $F_2$ and $XeF_2$ Gases; Ellipsometric Study," Surface Science, 206–14 (1999).

Wang, X., et al., "Gas–phase silicon etching with bromine trifluoride," Transducers, 1997 Conference on Solid–State Sensors and Actuators.

Streller, U., et al., "Selectivity in Dry Etching of Si(100) with $XeF_2$ and VUV Light," Applied Surface Science, (1996) 341–46.

Habuka, H. et al., "Dominant overall chemical reaction in a chlorine trifluoride–silicon–nitrogen system at atmospheric pressure," Jpn. J. Appl. Phys., (1999) 38 6466–69.

Fabrication of High Aspect Ratio Nanostructures in Si Using an Atomic Fluorine Beam http://www.nhn.ou.edu/johnson/Research/SPM_Litho/F_etch/, 1999.

Larson, P. R., et al., "Atomic Fluorine Bean Etching of Silicon and Related Materials," J. Vac. Sci. Tech. B (1999).

Ibbotson, D.E. et al., "Plasmaless Dry Etching of Silicon with Fluorine–Containing Compounds," J. Appl. Phys. 56 (10), pp. 2939–2942, Nov. 1984.

Ibbotson, D.E. et al., "Comparison of XeF2 and F–Atom Reactions with Si and SiO2," Appl. Phys. Lett. 44 (12), pp. 1129–1131, Jun. 1984.

Larson, P.R. et al., "Atomic Fluoriine Beam Etching of Silicon and Related Materials," J. Vac. Sci. Technol. B, manuscript #11599, Sep. 12, 1999.

"Fabrication of High Aspect Ratio Nanostructures in Si Using an Atomic Fluorine Beam," http://www.nhn.ou.edu/~johnson/Research/SPM_Litho/F_Etch/, Aug. 1999.

Mucha et al., "Chemiluminescence and the reaction of molecular fluorine with silicon," J. Phys. Chem., vol. 85, pp. 3529–3532, American Chemical Society (1981).

Mucha et al., "Chemiluminescent reaction of $SiF_2$ with fluorine and the etching of silicon by atomic and molecular fluorine," 53 (6), pp. 4553–4554, American Institute of Physics (Jun. 1982).

Flamm et al., "$XeF_2$ and F–atom reactions with Si: their signifance for plasma etching," Solid State Technology, Apr. 1993, pp. 117–121.

Astron, "Reactive Gas Generators," MKS Instruments, Inc. www.mksinst.com/pdf/astron 12.pdf © 2003, no month.

MKS ASTeX Products Announces ASTRON Ser High Flow Reactive Gas Generators for Process Chamber Cleaning Applications, from www.astex.com/prastrone.html, Nov. 12, 2001.

* cited by examiner

FLUORINE PROCESS FOR CLEANING SEMICONDUCTOR PROCESS CHAMBER

CROSS REFERENCE TO RELATED APPLICATION

This patent application is a divisional of application Ser. No. 09/535,692 filed Mar. 27, 2000, now abandoned.

FIELD OF THE INVENTION

The invention relates to processes for cleaning or removing residue from the interior surfaces of a vacuum chamber used for fabricating electronic devices. More specifically, the invention relates to the use of fluorine gas in such a process.

BACKGROUND OF THE INVENTION

Processes for fabricating electronic devices containing semiconductors generally include steps in which layers or features of material are deposited or patterned (i.e., etched) within a vacuum chamber, generally called a semiconductor process chamber. The chemical byproducts and unused reagents of such deposition or etch processes are mostly exhausted from the chamber by an exhaust pump, but some residue unavoidably deposits on the chamber wall and on other surfaces within the chamber. Such residue must be cleaned or removed periodically in order to maintain consistent process conditions and to prevent the residue from flaking off and contaminating the electronic device being fabricated.

A conventional method of cleaning residue from the interior surfaces of the chamber is to supply to the chamber interior a gas mixture containing radicals produced by the plasma decomposition of fluorine-containing gas compounds. The plasma may be produced inside the chamber or in a remote plasma source. In particular, such fluorine-containing gas compounds conventionally are used to remove residue containing silicon, silicon oxide, or silicon nitride. Such residue commonly is produced by processes for depositing silicon, silicon oxide, or silicon nitride on a substrate, or by processes for sputter etching or reactive ion etching of such materials on a substrate.

One disadvantage of cleaning processes using such fluorine-containing gas compounds is that such gases are believed to contribute to global warming if they are released to the earth's atmosphere after use. Government regulations are expected to impose increasing restrictions on the use of global warming gases, so there is a need to develop alternative gas chemistries.

SUMMARY OF THE INVENTION

The invention is a process for cleaning or removing residue from the interior of a semiconductor process chamber using molecular fluorine gas ($F_2$) as the principal precursor reagent. Molecular fluorine gas has the advantage of not being a global warming gas, unlike other fluorine-containing gas compounds conventionally used for chamber cleaning such as $NF_3$, $C_2F_6$ and $SF_6$.

I discovered that fluorine atoms and radicals produced by plasma decomposition of molecular fluorine gas effectively remove silicon, silicon oxide, and silicon nitride residues. In addition, I discovered that molecular fluorine gas effectively removes silicon residues without any plasma.

DETAILED DESCRIPTION OF THE PREFERRED EMBODIMENTS

The chamber cleaning processes of the invention were tested in a conventional, commercially available vacuum chamber for performing CVD processes for depositing films on large substrates or workpieces such as the glass substrates used for fabricating thin film transistor (TFT) flat panel displays.

In the commercial production of such displays, it often is desirable to deposit different films in succession while the substrate remains in the chamber. Therefore, a process for cleaning the interior of the chamber preferably should be capable of removing all the residues created by all of the different deposition processes performed in the chamber.

I discovered that a mixture of atomic fluorine (F) and molecular fluorine gas ($F_2$) produced by plasma decomposition of molecular fluorine gas ($F_2$) would successfully clean any of the three films commonly deposited in a plasma CVD chamber for fabricating TFT displays or other silicon-based semiconductor devices—silicon nitride, silicon oxide, and amorphous silicon films—as well as the residue produced by the processes for chemical vapor deposition (CVD) of any of these three films. This was tested using a conventional microwave remote plasma source chamber (RPSC) to supply a mixture of atomic and molecular fluorine to the conventional CVD chamber that was to be cleaned.

Processes for sputter etching or reactive ion etching of silicon nitride, silicon oxide, and silicon films generally deposit some of the material of the film being etched onto interior surfaces of the etch process chamber. Therefore, the cleaning processes of my invention should be effective for cleaning etch process chambers as well as CVD process chambers.

Experimental Results

Essentially pure molecular fluorine gas was supplied to a plasma chamber distinct from the CVD chamber to be cleaned. Such a chamber commonly is identified as a "remote" plasma chamber. The molecular fluorine within the remote chamber was excited to a plasma state by microwave energy coupled to the remote chamber from a microwave electrical power supply. The exhaust port of the remote microwave plasma chamber was connected to a gas inlet port of the CVD chamber to be cleaned, so that a mixture of atomic fluorine and molecular fluorine produced in the remote plasma chamber was pumped into the CVD chamber. An exhaust pump connected to the CVD chamber established a pressure in the range of 250 to 600 mT in the CVD chamber during cleaning.

First, the amount of microwave power required to decompose the molecular fluorine into atomic fluorine was determined. Fluorine gas was supplied to a conventional microwave remote plasma chamber at flow rates of 1000 sccm and 2000 sccm. Microwave energy at a frequency of 2.4 GHz was coupled to the remote chamber at power levels ranging from 2000 to 4000 watts. The ratio of atomic fluorine to molecular fluorine was measured at the chamber exhaust port. The measured ratio was about 3 to 2 (i.e., 60% atomic fluorine and 40% molecular fluorine) at any power from 2500 W to 4000 W. This data indicates that 2500 W would be sufficient. Nevertheless, 4000 W of microwave power was used in the cleaning process tests described below.

To test the cleaning processes, three different plasma CVD processes were separately performed in the CVD chamber. The three plasma CVD processes were: (1) depositing 1 micron of $SiN_x$ using a gas mixture provided by 110 sccm $SiH_4$, 550 sccm $NH_3$ and 3500 sccm $N_2$; (2) depositing 1 micron of $SiO_x$ (primarily $SiO_2$) using 330 sccm $SiH_4$ and 8000 sccm $N_2O$; and (3) depositing 0.25 micron of amorphous silicon (a-Si) using 50 sccm $SiH_4$ and 1400 sccm $H_2$. In all cases the specified film thickness was deposited on a 40×50 cm glass substrate. Each of the three CVD processes produced a different residue on the walls of the chamber.

After performing each CVD process, I compared the time required to clean the resulting residue from the chamber walls using a conventional process using plasma decomposition of $NF_3$, and using the process of the present invention using plasma decomposition of molecular fluorine gas ($F_2$).

The residue produced by the $SiN_x$ CVD process was cleaned in the same time by either 3000 sccm $F_2$ or 2000 sccm $NF_3$. Therefore, the present invention was just as effective as the conventional $NF_3$ process.

The cleaning rate was a linear function of the flow rate of $F_2$ into the remote plasma chamber. Reducing the $F_2$ flow rate to 2000 sccm and 1000 sccm, respectively, reduced the cleaning rate (i.e., increased the cleaning time) by 36% and 72%, respectively.

Adding nitrogen or hydrogen gas to the molecular fluorine gas supplied to the remote plasma chamber did not affect the cleaning rate. Specifically, with a $F_2$ flow rate of 1000 sccm, adding either 200 sccm $H_2$ or 500 to 1000 sccm $N_2$ did not affect the cleaning rate.

Supplying to the remote plasma chamber a gas mixture having equal molecular molar concentrations of $F_2$ and $NF_3$ resulted in a cleaning time halfway between the cleaning times using the same total flow rate of either $F_2$ or $NF_3$ alone. This result indicates that the two reagents are linearly additive, and that the cleaning process using $F_2$ will work with a cleaning gas mixture including at least a 50% molecular molar concentration of $F_2$. Nevertheless, to maximize the benefits of the invention, the molar concentration of $F_2$ in the reagent gas mixture preferably should be at least 70%, more preferably at least 80%, and most preferably at least 90%. Mixing the molecular fluorine with a nonreactive carrier gas such as helium should not affect the process other than to reduce the etch rate in proportion to the reduction in the flow rate of molecular fluorine.

The residue produced by the $SiO_x$ CVD process was cleaned by either 3000 sccm $F_2$ or 2000 sccm $NF_3$ at about the same rate as the residue produced by the $SiN_x$ CVD process. Therefore, the present invention was just as effective as the conventional $NF_3$ process. Reducing the flow rate of $F_2$ to 2000 sccm reduced the cleaning rate (i.e., increased the cleaning time) by 28%.

While the $F_2$ process of the present invention required a higher gas flow rate than the conventional $NF_3$ process, $F_2$ gas is not considered a global warming gas. Therefore, the present invention is an improvement over the $NF_3$ process.

The residue produced by the amorphous silicon CVD process was cleaned in 59 seconds by 1000 sccm $F_2$ at 370 mT chamber pressure (within the CVD chamber), and it was cleaned in 32 seconds by 2000 sccm $F_2$ at 570 mT chamber pressure. The comparative cleaning rate using $NF_3$ was not tested.

I also tested whether the cleaning rate could be increased by producing a plasma within the CVD chamber whose walls were to be cleaned. The metal gas distribution plate (or "anode" electrode), through which the gases from the remote microwave plasma chamber are dispensed into the CVD chamber, was connected to an RF power supply (the "anode" power supply). The walls of the chamber and all other metal components of the chamber were electrically grounded. The RF power excited the gases within the CVD chamber to a plasma state.

The effect of adding anode power was tested by first producing residue on the walls of the CVD chamber by depositing 1 micron of $SiO_x$ on a substrate within the CVD chamber using the $SiO_x$ CVD process described above. Then, the residue was cleaned by either of two processes: (1) the previously described process in which pure molecular fluorine was supplied to the remote microwave plasma chamber with no anode power in the CVD chamber, or (2) an otherwise identical cleaning process with 400 watts of 13.56 MHz RF power applied to the gas distribution plate of the CVD chamber. The anode power increased the cleaning rate (reduced the cleaning time) by 21%.

Conventional Hardware for Implementing the Cleaning Process

The cleaning process of the invention is useful for cleaning any kind of vacuum chamber whose interior surfaces accumulate residue as a result of deposition or patterning processes performed within the chamber. The design and operation of conventional CVD and etch chambers are described in the following commonly-assigned U.S. patents, the entire content of each of which is hereby incorporated by reference in this patent specification: U.S. Pat. No. 4,854,263 issued Aug. 8, 1989 to Chang et al.; U.S. Pat. No. 5,000,113 issued Mar. 19, 1991 to Wang et al.; U.S. Pat. No. 5,366,585 issued Nov. 22, 1994 to Robertson et al.; and U.S. Pat. No. 5,844,205 issued Dec. 1, 1998 to White et al.

The cleaning process of the invention requires some apparatus for dissociating at least a portion of the molecular fluorine ($F_2$) reagent to produce atomic fluorine. In all the tests described above, this dissociation was accomplished by means of a conventional remote microwave plasma source, i.e., a remote plasma chamber coupled to receive energy from a microwave electrical power supply. Remote microwave plasma sources are described in more detail in the following US patents, the entire contents of each of which are hereby incorporated into this patent specification: U.S. Pat. No. 5,780,359 issued Jul. 14, 1998 to Brown et al.; U.S. Pat. No. 5,788,778 issued Aug. 4, 1998 to Shang et al.; and U.S. Pat. No. 5,812,403 issued Sep. 22, 1998 to Fong et al. U.S. Pat. No. 5,780,359 shows a remote microwave plasma source used in combination with RF power applied to the susceptor of a magnetically enhanced reactive ion etching (MERIE) chamber.

Alternatively, any other conventional means can be used to dissociate at least a portion of the molecular fluorine reagent to produce atomic fluorine.

For example, the remote plasma source could be excited by (i.e., coupled to receive energy from) a source of electromagnetic energy other than a microwave power supply. More specifically, an RF electrical power supply can be inductively or capacitively coupled to the remote plasma chamber. An experimental test fixture in which 14 MHz RF power was capacitively coupled to a remote plasma source in order to decompose molecular fluorine to atomic fluorine is described in D. L. Flamm et al., "Reaction of fluorine atoms with $SiO_2$", J. Appl. Phys., vol. 50, no. 10, pages 6211–6213 (October 1979), the entire contents of which is hereby incorporated by reference into this patent specification. However, expected advantages of excitation by microwave frequencies (over 1 GHz) over RF frequencies (less than 1 GHz) is that the higher frequencies typically can sustain a plasma at higher chamber pressures, and higher frequencies may require less power to dissociate a given percentage of the molecular fluorine.

As another example, instead of using a remote plasma source, the molecular fluorine gas can be supplied directly to the process chamber that is to be cleaned, and at least a portion of the gas can be dissociated by producing a plasma within the process chamber ("in situ" plasma) by any conventional plasma excitation means such as microwave power or inductively or capacitively coupled RF power. U.S.

Pat. No. 5,620,526 issued Apr. 15, 1997 to Watatani et al. describes a conventional electron cyclotron resonance apparatus for coupling microwave power via a microwave waveguide to a plasma chamber. Commonly-assigned U.S. Pat. No. 5,454,903 issued Oct. 3, 1995 to Redeker et al. discloses an RF power supply inductively coupled to a CVD or etch vacuum chamber to produce an in situ plasma for cleaning the chamber. An RF power supply capacitively coupled to a semiconductor process chamber for producing an in situ plasma for cleaning the chamber is disclosed in U.S. Pat. No. 5,632,821 issued May 27, 1997 to Doi and in commonly-assigned U.S. Pat. Nos. 4,960,488 issued Oct. 2, 1990 to Law et al. and U.S. Pat. No. 5,756,400 issued May 26, 1998 to Ye et al. The entire contents of each of the patents listed in this paragraph is incorporated by reference into this patent specification.

A disadvantage of using an in situ plasma instead of a remote plasma source is that an in situ plasma can increase corrosion of the chamber components by ion bombardment. However, in situ plasma has the advantage of avoiding the expense of a remote plasma chamber.

Cleaning Process without Plasma

I also tested whether molecular fluorine ($F_2$) gas would remove from a surface any of the three films discussed above—silicon nitride ($SiN_x$), silicon oxide ($SiO_x$), and amorphous silicon (a-Si)—without producing any plasma during the cleaning process. Instead of using a plasma to decompose the $F_2$, the temperature of the surface to be cleaned was elevated sufficiently to cause the $F_2$ to react with the film to be removed from the surface.

For these tests, rather than cleaning actual residue from a chamber wall, I tested whether the fluorine gas would remove any of these three films from a heated substrate mounted within the chamber. Specifically, I mounted on a susceptor three 80×80 mm glass substrates respectively coated with these three films. The susceptor was heated to 450° C. in an attempt to cause the $F_2$ to react with the film to be removed from the substrate. The fluorine did not etch the silicon nitride or silicon oxide, but it did remove the amorphous silicon. Using a fluorine gas flow rate of 1000 sccm, the amorphous silicon was etched at a rate of 5000 Å/min. Alternatively, the amorphous silicon can be etched from chamber surfaces with gas mixtures containing at least fifty percent, preferably at least seventy percent, molecular fluorine.

This demonstrates that molecular fluorine gas, without plasma excitation (i.e., without plasma-assisted decomposition of the $F_2$), can clean amorphous silicon. Amorphous silicon would be the principal residue produced on a chamber wall by a thermal or plasma-enhanced process for depositing silicon on a substrate, or by a process for removing silicon from a substrate by sputter etching or reactive ion etching. Therefore, this thermal (non-plasma) cleaning process should be effective for cleaning residue from the interior surfaces of chambers used for any of such silicon deposition or silicon etch processes.

Although the thermal cleaning process was tested only at a susceptor temperature of 450° C., it is predictable that the temperature of the surface from which the silicon is to be cleaned need not be so high. It is a matter of routine experimentation to determine the minimum temperature to which the surface to be cleaned must be elevated in order to cause the $F_2$ gas to react with and remove any silicon material on such surface.

What is claimed is:

1. A process for removing amorphous silicon residue from at least one surface of one or more chamber components exposed to the interior of a semiconductor or flat panel display process chamber, comprising:
   supplying a gas consisting of molecular fluorine to the process chamber; and
   elevating the temperature of said at least one surface sufficiently for removal of at least a portion of said amorphous silicon residue from said at least one surface;
   wherein said amorphous silicon residue is removed in the absence of any plasma in the chamber.

2. A process according to claim 1, further comprising depositing a film on a substrate within the process chamber so as to produce said amorphous silicon residue on said at least one surface.

3. A process according to claim 2, wherein said film includes amorphous silicon.

4. A process according to claim 1, wherein said process chamber is heated to at least about 450° C.

5. A process according to claim 1, wherein said amorphous silicon residue to be removed results from a thermal or plasma-enhanced process for depositing amorphous silicon on a substrate.

6. A process according to claim 1, wherein said amorphous silicon residue to be removed results from a process for removing silicon from a substrate by sputter etching or reactive ion etching.

7. A process for removing amorphous silicon residue from a flat panel display process chamber, comprising:
   supplying a gas consisting of molecular fluorine to the flat panel display process chamber; and
   elevating the temperature of said chamber sufficiently for removal of at least a portion of said amorphous silicon residue therefrom;
   wherein said amorphous silicon residue is removed in the absence of any plasma in the flat panel display process chamber.

8. A process according to claim 7, further comprising depositing a film on a substrate within the flat panel display process chamber so as to produce said amorphous silicon residue on said at least one surface.

9. A process according to claim 8, wherein said film includes amorphous silicon.

10. A process according to claim 7, wherein said process chamber is heated to at least about 450° C.

11. A process according to claim 7, wherein said amorphous silicon residue to be removed results from a thermal or plasma-enhanced process for depositing amorphous silicon on a substrate.

12. A process according to claim 7, wherein said amorphous silicon residue to be removed results from a process for removing silicon from a substrate by sputter etching or reactive ion etching.

* * * * *